United States Patent [19]

Koike et al.

[11] Patent Number: 4,491,629

[45] Date of Patent: Jan. 1, 1985

[54] WATER SOLUBLE PHOTORESIST COMPOSITION WITH BISAZIDE, DIAZO, POLYMER AND SILANE

[75] Inventors: Norio Koike; Takeo Ito, both of Fukaya; Shingo Watanabe, Himeji; Kunihiro Ikari, Yokosuka, all of Japan

[73] Assignee: Tokyo Shibaura Denki Kabushiki Kaisha, Kanagawa, Japan

[21] Appl. No.: 467,886

[22] Filed: Feb. 18, 1983

[30] Foreign Application Priority Data

| Feb. 22, 1982 | [JP] | Japan | 57-25935 |
| Feb. 22, 1982 | [JP] | Japan | 57-25936 |
| Feb. 22, 1982 | [JP] | Japan | 57-25937 |

[51] Int. Cl.³ .................. G03C 1/60; G03C 1/70; G03F 7/26
[52] U.S. Cl. ..................... 430/176; 430/28; 430/165; 430/167; 430/177; 430/179; 430/196; 430/197; 430/272
[58] Field of Search .............. 430/28, 165, 176, 177, 430/179, 196, 197, 272, 167

[56] References Cited

U.S. PATENT DOCUMENTS

| 2,937,085 | 5/1960 | Seven et al. | 430/176 |
| 3,387,975 | 6/1968 | Tamura | 430/28 |
| 3,549,368 | 12/1970 | Collins et al. | 430/167 |
| 3,615,538 | 10/1971 | Peters et al. | 430/167 |
| 3,679,419 | 7/1972 | Gillich | 430/175 |
| 3,917,794 | 11/1975 | Akagi et al. | 430/25 |
| 4,099,973 | 7/1978 | Miura et al. | 430/167 |

FOREIGN PATENT DOCUMENTS

| 51-19982 | 6/1976 | Japan . | |
| 51-48946 | 12/1976 | Japan . | |
| 53-59506 | 5/1978 | Japan | 430/28 |
| 56-06530 | 2/1981 | Japan | 430/145 |
| 1376114 | 12/1974 | United Kingdom | 430/196 |

Primary Examiner—Charles L. Bowers, Jr.
Attorney, Agent, or Firm—Cushman, Darby & Cushman

[57] ABSTRACT

Photoresist compositions based upon a water-soluble polymer are disclosed together with a water-soluble bisazide compound as a cross-linker, a water-soluble adhesion-improving diazo compound are characterized in that a water-soluble silane compound is included. The compositions are photosensitive, particularly to ultraviolet rays, and adhere well to the substrates to which they are applied. The compositions of the invention are used as photoresists.

9 Claims, No Drawings

WATER SOLUBLE PHOTORESIST COMPOSITION WITH BISAZIDE, DIAZO, POLYMER AND SILANE

BACKGROUND OF THE INVENTION

The present invention relates to a photoresist composition showing high sensitivity and having improved adhesion to a substrate.

Photoresist compositions are widely used for plate making and photo-etching and must have the following characteristics: (a) high resolution, (b) high sensitivity, (c) stability quality in preservation, (d) a sufficiently hard photoresist layer to resist corrosion and abrasion, (e) adhesion to a substrate is strong and having a wide latitude in developing, (f) both the photoresist itself and developing solution should not cause pollution.

Conventionally a dichromate series photoresist made of a mixture of dichromate and a water-soluble polymer, for example glue, gelatin, albumin (egg white) and polyvinyl alcohol, is used widely for plate making and photo etching. Dichromate, $Cr_2O_7^{2-}$ is used to harden the polymer. The reason is that this photoresist is cheap and approximately meets the above-mentioned criteria (a), (b), (d) and (e). However, this type of photoresist gradually changes its quality by a natural reaction, the so-called "dark reaction", even though it is stored in the dark, and the photoresist becomes unusable. Further, there are pollution problems if chromium is used as the cross-linking agent.

To resolve the above-mentioned drawbacks, it has been suggested to make a photoresist composition by introducing a photosensitivity radical into the polymeric material itself or by mixing an organic photosensitive agent with a polymeric material.

As one of these attempts, a photoresist comprising a water-soluble polymer mixed with a light-sensitive organic cross-linking agent instead of dichromate is known. See Japanese Patent Publication No. 48,946/1976. For example, a photoresist composition comprised a water-soluble bisazide compound having a hydrophilic radical, for example 4,4'-bisazidostilbene-2,2'-disulfonic acid or its salt, and a water-soluble polymer, for example polyacrylamide, polyvinylpyrrolidone or gelatin, is known. This bisazide photoresist varies its characteristics according to the characteristics of a water-soluble polymer combined. This photoresist approximately meets the above-mentioned criteria (a), (b), (c) and (e). However, this type of photoresist generally has weak adhesion to the substrate. Weak adhesion causes low resolution. That is, to obtain an adequate resolution, strict developing control is required. Overdeveloping causes a hardened photoresist layer to peel off from the substrate while, in contrast, a weak developing causes the unhardened part to remain on the substrate which is also undesirable. The bisazide-type photoresists also cannot be formed into a pattern if it is exposed to light below a predetermined value. In other words these photoresists have the characteristics of reciprocity law failure, so that as a consequence the bisazide-type photoresists are not widely used for practical reasons.

Generally, a bisazide photoresist has weaker adhesion to the substrate than a dichromate photoresist. The reason is unclear, however, it can be considered that in a dichromate photoresist a chrome ion acts as a connector for connecting a polymer with the substrate. On the contrary, a bisazide photoresist has no such function.

Therefore, in order to remove this drawback a method for improving the adhesion has been proposed. Japanese Patent Publication No. 19,982/1976 discloses the photoresist composition comprising a bisazide compound, a suitable water-soluble polymer and at least one silane compound selected from the γ-aminopropyltriethoxysilane, N-(β-aminoethyl)-γ-aminopropyltrimethoxysilane and N-(β-aminoethyl)-γ-aminopropyltrimethoxysilane as an adhesive activator. However, a bisazide photoresist containing the silane compounds still does not provide adequate adhesion.

SUMMARY OF THE INVENTION

A primary object of the present invention is to provide a photoresist composition that is virtually pollution free.

The other object of the present invention is to provide a photoresist composition having good adhesion to the substrate and upon development capable of forming a strong layer.

Further object of the present invention is to provide a photoresist composition having good resolution and high sensitivity that is also resistant to deterioration when stored for a period of time.

Therefore, the present invention provides a photoresist composition comprising a photosensitive composition containing a water-soluble bisazide compound, a water-soluble diazo compound and a water-soluble polymer; and a water-soluble silane compound.

DETAILED DESCRIPTION OF THE EMBODIMENT

As a water-soluble bisazide compound used in the present invention, a known compound, for example 4,4'-bisazidostilbene-2,2'-disulfonic acid; 4,4'-diazobenzalacetophenone-2-sulfonic acid; 4,4'-bisazido stillbene-α-carboxylic acid and their salts described in Japanese Patent Publication Nos. 48,946/1976, can be used.

As the water-soluble diazo compound used in the present invention, a known compound, for example benzidine tetrazoniumchloride; 3,3'-dimethylbenzidine tetrazoniumchloride; 3,3'-dimethoxybenzidine tetrazoniumchloride; 4,4'-diaminodiphenylamine tetrazoniumchloride; 3,3'-diethyl benzidine tetrazoniumsulfate; diazodiphenylamine formaldehyde condensation products and their double salts as described in Japanese Patent Publication Nos. 3,276/1977 and 6,530/1981, can be used. These water-soluble diazo compounds are believed to improve the adhesion of the photosensitive composition itself to the substrate.

As a water-soluble polymer one may use any of the polymers, for example, a synthetic polymer such as polyvinyl alcohol, polyvinylpyrrolidone, polyacrylamide, polyvinylmethylether and polyvinylacetal, polyacryl acid; a natural polymer such as gelatin, shellac, gum arabic and casein; a copolymer such as a copolymer of maleic acid-vinylmethyether, a copolymer of acrylamidediacetoneacrylamide and a copolymer of an acrylamidevinyl alcohol; a graft copolymerized polymer such as acrylonitrile graft copolynerized with polyvinyl alcohol, glycidyl methacrylate graft copolymerized with polyvinyl alcohol and β-oxyethylmethacrylate graft polymerized with polyvinyl alcohol; and a semisynthetic polymer, such as carboxymethylcellulose, hydroxymethylcellulose, hydroxypropylcellulose and poly-L-sodium glutamate can be used. At least one of these water-soluble polymers is required to cross-link with the water-soluble bisazide compound and/or the water-soluble diazo compound by ultraviolet rays.

A combination of a polyvinylpyrrolidone and a polyvinyl alcohol is preferred as the water-soluble polymer for the present invention. In this case, a mixture ratio of polyvinylpyrrolidone to polyvinyl alcohol is 0.1:1 to 8.0:1 in weight, and is preferably 0.5:1 to 3.0:1. If that ratio is less than 0.5:1, a clear pattern cannot be obtained and the ratio is more than 3.0:1, the adhesion decreases.

When the water-soluble polymer comprising polyvinylpyrrolidone and polyvinyl alcohol meeting the above-mentioned condition is used, a mixture ratio of water-soluble bisazide compound to water-soluble diazo compound is set at 1.0:1 to 10.0:1 by weight, preferably 3.0:1 to 7.0:1. If the ratio is less than 3.0:1, the photosensitive composition has reduced sensitivity while if that ratio is greater than 7.0:1, the adhesion decreases.

A photoresist composition according to the present invention further includes a water-soluble silane compound as an adhesive activator. As a water-soluble silane compound, a polyazamidesilane compound having the following general formula:

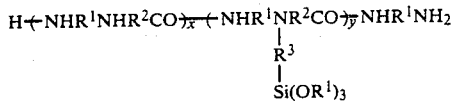

in which $R^1$, $R^2$ and $R^3$ are independently alkylenes containing 1 to 10 carbon atoms and x and y are integers having a value from 1 to 10, is used.

Suitable polyazamidesilane compounds are described in Society of Plastic Industry, Volume 30, Chapter 22, 6 (1975). For example, a compound responding to the above general formula is described in detail, in which $R^1$ is a methylene, $R^2$ is an ethylene, $R^3$ is a propylene and $x=y=2$.

A water-soluble polyaminosilane compound shown by a following general formula:

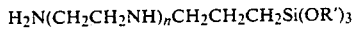

in which R' is methylene or ethylene, and n is an integer from 2 to 10, is also used as a water-soluble silane compound according to the present invention.

Suitable water-soluble polyaminosilane compounds are, for example,

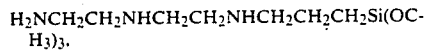

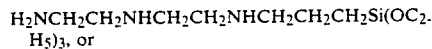

These can be used as such or as mixtures thereof.

Furthermore, γ-aminopropyltriethoxysilane, N-(β-aminoethyl)-γ-aminopropyltrimethoxysilane and γ-ureidepropyltriethoxysilane may be used as a water-soluble silane compound either singly or as mixtures thereof.

Above-described water-soluble silane compounds have two or more different functional groups in the molecule. One functional group reacts with a hydroxyl group existing on the substrate, for example a glass plate, a metal plate and a ceramic plate, or the hydroxyl group reacts with water absorbed to the substrate, and consequently improves the adhesion. The other functional group effects an affinity of the silane to the water-soluble polymer and thereby imparts good adhesion to the photoresist composition.

The water-soluble silane compounds described above are preferable from the viewpoint of safety in that chromium ions are not present.

In the present invention, an amount of the water-soluble silane compound is about 0.01 to about 20 parts by weight per 100 parts by weight of the water-soluble polymer, although preferably about 0.1 to 10 parts by weight is used to improve adhesion to the substrate.

Further, the photoresist composition according to the present invention shows an extreme high sensitivity caused by using a combination of a water-soluble bisazide compound and a water-soluble diazo compound as a cross-linking agent to the water-soluble polymer. This sensitivity cannot be obtained when the cross-linking agent is used by itself.

Furthermore, adding a small amount of surface active agent, for example polyethylene glycol, phenoxy polyethylenoxide phosphoric ester and sodium hexametaphosphate; or a small amount of alcohol, for example ethyl alcohol, glycerin, ethyleneglycol, sorbitol and tet-butyl alcohol; is useful for improving foam breaking and film-forming.

The present invention will be further described and explained with reference to the following non-limiting examples in which all parts and percentages are by weight and all temperatures are reported in degrees centigrade. The compositions of the invention can comprise, consist essentially of or consist of the materials set forth.

COMPARATIVE EXAMPLE

Water-soluble photoresist compositions described in Table 1 were prepared then applied to a process of making a light-absorbing layer on a color cathode ray tube. The sensitivities of the resulting layers were examined.

TABLE 1

| Sample | composition (weight ratio) | |
|---|---|---|
| | PVP*/PVA* | bisazide compound/diazo compound |
| 1 | 1.0 | bisazide compound alone |
| 2 | 1.0** | 5.0 |
| 3 | 1.0 | diazo compound alone |

*Polyvinylpyrrolidone (PVP) to polyvinyl alcohol (PVA)
**according to the invention.

The sensitivities with respect to ultraviolet rays are shown in Table 2. Sensitivity is defined as an exposure time necessary to form a pattern size of 0.19 mm in diameter (at the center) from a hole of 0.2 mm size in the shadow mask in a 20" color cathode ray tube when it is exposed by 30,000 lux.

TABLE 2

| Sample | Exposure Time |
|---|---|
| 1 | 30 seconds |
| 2 | 10 seconds |
| 3 | 20 seconds |

It is understood that the photoresist composition according to the present invention has a high sensitivity.

Additional embodiments of the present invention are described below.

EXAMPLES 1-9

Polyvinylpyrrolidone (K-90, GAF) of 50 parts by weight, a polyvinyl alcohol (EG-40, Nippon Gousei Co.) of 50 parts by weight, 4,4'-bisazidostilbene-2,2'-sodium disulfonate 6 parts by weight, and diazodiphenylamine formaldehyde condensed phosphate 1.2 parts by weight dissolved in water, 8000 parts by weight to form a stock solution. Nine types of water-soluble silane compounds shown in Table 4 were added to the above-prepared solutions and nine photoresist compositions were prepared. The amount of each water-soluble silane compound used was 6 parts by weight. The photoresist compositions were coated as liquids on glass substrates of 100 mm × 100 mm, then dried. Next, a mask having apertures of 0.35 mm in diameter, which apertures were arranged in two dimensions in a 0.6 mm pitch, were contacted with the photoresist coated substrate. Then, the photoresist was exposed by a super high pressure mercury lamp of 500 watts for one minute. The thus exposed products were developed under the conditions shown in Table 3 to compare the adhesion of the respective formulations.

TABLE 3

| | |
|---|---|
| water pressure | 2.0 kg/cm$^2$ |
| temperature of liquid | 40 to 41° C. |
| distance between the nozzle and the panel | 300 mm |
| diameter of nozzle | 1.0 mm |
| developing time | 20 seconds |

The number of peeling dots of the hardened photoresist per unit area were counted and the results are shown in Table 4.

TABLE 4

| Example | water-soluble silane compound | number of peeling dots/100 cm$^2$ |
|---|---|---|
| 1 | Y-5922* | 0 |
| 2 | Y-5923* | 0 |
| 3 | Y-5936* | 0 |
| 4 | H$_2$N(CH$_2$CH$_2$NH)$_2$CH$_2$CH$_2$CH$_2$Si(OCH$_3$)$_3$ | 0 |
| 5 | H$_2$N(CH$_2$CH$_2$NH)$_6$CH$_2$CH$_2$CH$_2$Si(OCH$_3$)$_3$ | 0 |
| 6 | H$_2$N(CH$_2$CH$_2$NH)$_2$CH$_2$CH$_2$CH$_2$Si(OC$_2$H$_5$)$_3$ | 0 |
| 7 | γ-aminopropyltriethocysilane | 3 |
| 8 | N—(β-amino ethyl)-γ-aminopropyltriemethoxysilane | 0 |
| 9 | γ-ureidepropyltriethoxysilane | 2 |

*A product of Union Carbide Co. responding to the general formula given above.

Each of the photoresist compositions described above has good resolution of about 20 μm and the resulting hardened layer satisfies the required corrosion resistance and the durability for practical use. These photoresist compositions are quite storage stable and scarcely change in quality in the dark at the room temperature for one month.

COMPARATIVE EXAMPLES A-C

The adhesive activators listed in Table 5 are used. Photoresist liquids were prepared by dissolving a polyvinylpyrrolidone (K-90, GAF) of 100 parts by weight and 4,4'-bisazidostilbene-2,2'-sodium disulfonate of 10 parts by weight into 3000 parts by weight of water. In comparisons B and C, adhesive activators of 6 parts by weight were used respectively. The adhesions were examined by the same method shown in the Examples. The results are shown in Table 5.

TABLE 5

| Comparison | adhesive activator | number of peeling dots/100 cm$^2$ |
|---|---|---|
| A | none | 30 |
| B | H$_2$NCH$_2$CH$_2$NHCH$_2$CH$_2$CH$_2$Si(OCH$_3$)$_2$ | 4 |
| C | H$_2$NCH$_2$CH$_2$CH$_2$Si(OCH$_3$)$_2$ | 7 |

Table 6 shows the proportions of each component material of the photoresist composition according to the present invention.

TABLE 6

| | usable range | preferable range |
|---|---|---|
| Polymer/Total* | 0.5 to 50 wt % | 1 to 10 wt % |
| Bisazide cpd./Polymer | 1 to 30 wt % | 3 to 15 wt % |
| Bisazide cpd./Diazo cpd. | 100 to 1000 wt % | 300 to 700 wt % |
| Silane cpd./Polymer | 0.01 to 20 wt % | 0.1 to 10 wt % |

*Total weight of the photoresist composition (water included)

As discussed above, the photoresist compositions of the present invention have several advantages, for example (a) high adhesion to the substrate, (b) high sensitivity, (c) high resolution, (d) are able to form a corrosion resistance layer and are durable, (e) are stable in quality, and (f) are virtually pollution free. As such these compositions are useful for plate making and for photo etching.

What is claimed is:

1. A photoresist composition comprising:
a photosensitive composition comprising an admixture of a film-forming amount of a water-soluble, film-forming polymer comprising the combination of polyvinylpyrrolidone and polyvinyl alcohol; a cross-linking amount of a polymer-cross-linking, water-soluble photosensitive bisazide compound; a cross-linking amount of a polymer-cross-linking, adhesion-improving water-soluble photosensitive diazo compound; and
an adhesion-activating amount of a water-soluble polyazamidesilane compound having the following formula:

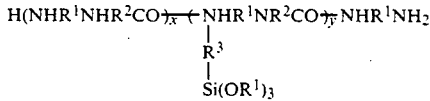

wherein R$^1$, R$^2$ and R$^3$ are independently alkylenes containing carbon 1 to 10 carbon atoms, and x and y are integers from 1 to 10.

2. The photoresist composition according to claim 1, wherein said water-soluble polymer comprises a mixture of polyvinyl pyrrolidone and polyvinyl alcohol, the weight ratio of said polyvinyl alcohol to said polyvinyl pyrrolidone is 1:0.5 to 1:3.0, and the weight ratio of said water-soluble diazo compound to said water-soluble bisazide compound is 1:3.0 to 1:7.0.

3. The photoresist composition according to claim 1, wherein the weight ratio of said polymer to said bisazide compound is 1:0.01 to 1:0.3, the weight ratio of said diazo compound to said bisazide compound is 1:1 to 1:10, and the weight ratio of said polymer to said silane compound is 1:0.001 to 1:0.2.

4. A photoresist composition comprising:

a photosensitive composition comprising an admixture of a film-forming amount of a water-soluble, film-forming polymer comprising the combination of polyvinylpyrrolidone and polyvinyl alcohol; a cross-linking amount of a polymer-cross-linking, water-soluble photosensitive bisazide compound; a cross-linking amount of a polymer-cross-linking, adhesion-improving water-soluble photosensitive diazo compound; and an adhesion-activating amount of a water-soluble polyaminosilane compound having the following formula:

$$H_2N(CH_2CH_2NH)_nCH_2CH_2CH_2Si(OR')_3$$

wherein R' is methyl or ethyl, and n is an integer from 2 to 10.

5. The photoresist composition according to claim 4, wherein said water-soluble polymer comprises a mixture of polyvinyl pyrrolidone and polyvinyl alcohol, the weight ratio of said polyvinyl alcohol to said polyvinyl pyrrolidone is 1:0.5 to 1:3.0, and the weight ratio of said water-soluble diazo compound to said water-soluble bisazide compound is 1:3.0 to 1:7.0.

6. A photoresist composition comprising:
a photosensitive composition comprising an admixture of a film forming amount of a water-soluble, film-forming polymer comprising the combination of polyvinylpyrrolidone and polyvinyl alcohol; a cross-linking amount of a polymer-cross-linking, water soluble photosensitive 4,4-bisazidestilbene-2,2'-disulfonicacid disodium salt; a cross-linking amount of a polymer-cross-linking, adhesion-improving water-soluble photosensitive diazodiphenylamine formaldehyde condensation product; and an adhesion-activating amount of a water-soluble polyazamidesilane compound having the following formula:

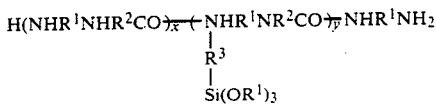

wherein $R^1$, $R^2$ and $R^3$ are independently alkylenes containing carbon 1 to 10 carbon atoms, and x and y are integers from 1 to 10.

7. The photoresist composition according to claim 6, wherein said water-soluble polymer comprises a mixture of polyvinylpyrrolidone and polyvinyl alcohol, the weight ratio of said polyvinyl alcohol to said polyvinylpyrrolidone is 1:0.5 to 1:3.0, and the weight ratio of said water-soluble diazodiphenylamine formaldehyde condensation product to said water-soluble 4,4'-bisazidestilbene-2,2'-disulfonicacid disodium salts is 1:3.0 to 1:7.0.

8. A photoresist composition comprising:
a photosensitive composition comprising an admixture of a film-forming amount of a water-soluble, film-forming polymer comprising the combination of polyvinylpyrrolidone and polyvinyl alcohol; a cross-linking amount of a polymer-cross-linking, water-soluble photosensitive 4,4-bisazidestilbene-2,2'-disulfonicacid photosensitive disodium salt; a cross-linking amount of a polymer-cross-linking, adhesion-improving water-soluble photosensitive diazodiphenylamine formaldehyde condensation product; and an adhesion-activating amount of a water-soluble polyaminosilane compound having the following formula:

$$H_2N(CH_2CH_2NH)_nCH_2CH_2CH_2Si(OR')_3$$

wherein R' is methyl or ethyl, and n is an integer from 1 to 10.

9. The photoresist composition according to claim 8, wherein said water-soluble polymer comprises a mixture of polyvinylpyrrolidone and polyvinyl alcohol, the weight ratio of said polyvinyl alcohol to said polyvinylpyrrolidone is 1:0.5 to 1:3.0, and the weight ratio of said water-soluble diazodiphenylamine formaldehyde condensation product to said water-soluble 4,4'-bisazidestilbene-2,2'-disulfonicacid disodium salts is 1:3.0 to 1:7.0.

* * * * *